United States Patent [19]

Hall

[11] Patent Number: 5,274,778
[45] Date of Patent: Dec. 28, 1993

[54] EPROM REGISTER PROVIDING A FULL TIME STATIC OUTPUT SIGNAL

[75] Inventor: Christopher M. Hall, Redwood City, Calif.

[73] Assignee: National Semiconductor Corporation, Santa Clara, Calif.

[21] Appl. No.: 532,065

[22] Filed: Jun. 1, 1990

[51] Int. Cl.$^5$ ............... G06F 12/00; G11C 16/06; G11C 29/00

[52] U.S. Cl. .................. 395/425; 365/185; 365/201; 365/189.05; 364/DIG. 2; 371/21.4; 371/21.1

[58] Field of Search ................ 395/425; 364/200 MS File, 900 MS File; 365/185, 201, 189.05; 371/21.1, 21.2, 21.4

[56] References Cited

U.S. PATENT DOCUMENTS

| | | | |
|---|---|---|---|
| 4,635,231 | 1/1987 | Mori et al. | 365/190 |
| 4,713,792 | 12/1987 | Hartmann et al. | 395/425 |
| 4,745,581 | 5/1988 | Sato et al. | 365/201 |
| 4,794,558 | 12/1988 | Thompson | 395/425 |
| 4,797,652 | 1/1989 | Hall | 364/736.5 |
| 4,908,796 | 3/1990 | Lee et al. | 365/189.05 |

FOREIGN PATENT DOCUMENTS 0459246 5/1991 European Pat. Off. .
2214379A 8/1989 United Kingdom .

OTHER PUBLICATIONS

"High-Voltage Regulation and Process Considerations for High-Density 5 V-Only E$^2$PROM's", by Duane H. Oto, Vinod K. Dham, Keith H. Gudger, Michael J. Reitsma, Geoffrey S. Gongwer, Yaw Wen Hu, Jay F. Olund, H. Stanley Jones, Jr., and Sidney K. Nieh, *IEEE Journal of Solid-State Circuits*, vol. SC-18, No. 5, Oct. 1983, pp. 532-537.

"EPROM-based Logic Chip Opens its Gates to All Flip-Flop Types, Clocks," by Robert Hartman and Sau-Ching Wong, *Electronic Design*, Jul. 11, 1985, pp. 109-118.

"A 9-Nanosecond, Low-Standby-Power CMOS PLD with a Single-Poly EPROM Cell," by S. Frake, M. Knecht, P. Cacharelis, M. Hart, M. Manley, R. Zeman, IEEE Intl. Sol. St. Ccts. Conf., Feb. 1989.

"Novel Circuit Techniques for Zero-Power 25-ns CMOS Erasable Programmable Logic Devices (EPLD's)" by Sau-Ching Wong, Hock-Chuen So, Chuan-Yung Hung, and Jung-Hsing Ou, Oct. 1986, *IEEE Journal of Solid-State Circuits*, vol. SC-21, No. 5, pp. 766-744.

"A 90ns 4Mb CMOS EPROM, " by George Canepa, Hernan Castro, Peter Hazen, Sandy Lee, Mark Holer, Sherif Sweha, and R. K. Wallace, *IEEE International Solid-State Circuits Conference, Feb. 18, 1988, pp. 120-121, 323*.

(List continued on next page.)

Primary Examiner—Glenn Gossage
Attorney, Agent, or Firm—Steven F. Caserza

[57] ABSTRACT

An EPROM register is programmed in a manner substantially similar to the manner used to program a main EPROM array contained on the same integrated circuit. Data in the main EPROM array must be read out by applying appropriate address and output enable signals. The EPROM register allows the data stored therein to be available at all times by providing a full-time static output signal. The register includes a static evaluation circuit for determining the data stored in the register, a precharge keeper circuit for providing a pseudo-static evaluation of the data, as well as providing a periodic refresh of the sense node during pseudo-static evaluation, and a margin test circuit for testing the threshold voltage of the register, as well as actual or relative shifts in the threshold voltage. The EPROM register serves as a nonvolatile memory which can be written to store configuration information for an integrated circuit.

36 Claims, 8 Drawing Sheets

OTHER PUBLICATIONS

"A 16K E²PROM Employing New Array Architecture and Designed-In Reliability Features," by Gioria Yaron, S. Jayasimha Prasad, Marsk S. Eble, and Bruce M. K. Leong, Oct. 1982, IEEE Journal of Solid-State Circuits, vol. SC-17, No. 5, pp. 833-839.

"16-K EE-PROM Relies on Tunneling for Byte-Eraseable Program Storage," by W. S. Johnson, G. L. Kuhn, A. L. Renninger, and G. Perlegos, *Electronics*, Feb. 28, 1980, p. 113-117.

"Reliability Aspects of a Floating Gate E²PROM," by Bruce Euzent, Nick Boruta, Jimmy Lee and Ching Jeng (1981), IEEE Proc. IRPS, pp. 11-16.

"A 19-ns 250 mW CMOS Erasable Programmable Logic Device," by Jagdish Pathak, Hal Kurkowski, Robert Pugh, Ritu Shrivasstave and Frederick B. Jenne, Oct. 1986, IEEE Journal of Solid-State Circuits, vol. SC-21, No. 5, pp. 775-783.

EPROM REGISTER PROVIDING A FULL TIME STATIC OUTPUT SIGNAL

BACKGROUND OF THE INVENTION

This invention pertains to memory cells, and more particularly a circuit for use in an integrated circuit including EPROM devices which allow the formation of an electrically programmable register.

Semiconductor memory devices are well known in the prior art. In many applications, it is desirable to provide a memory device which is non-volatile, i.e., which will not lose the contents of its memory when power is removed, but which can be erased and rewritten as desired. Toward this end, erasable programmable read only memories (EPROMs) and electrically erasable programmable read only memories (EEPROMs) have been employed in a wide variety of circuits, including, for example, stand alone memory chips and memory locations within microprocessors and microcontrollers.

EPROMs work by means of a floating gate which is located beneath a control gate. Ultraviolet light is used to erase the floating gate, by giving electrons stored on the floating gate sufficient energy to join the conduction band in the insulating oxide, where upon they leak off to the channel or substrate of the device. Programming is achieved by raising the control gate to a high voltage (typically 11 to 24 volts, depending on the process used to fabricate the EPROM), and the drain to another high voltage (typically 7 to 24 volts). Hot electrons are generated in the channel, some of which become stored on the floating gate, thereby increasing the control gate threshold voltage. An unprogrammed EPROM cell can not be turned on by a normal 5 volt read signal applied to its control gate, while an unprogrammed EPROM cell can be turned on by a 5 volt read signal.

One major disadvantage of EPROMs is that all bits within an array must be erased simultaneously, by the application of ultraviolet light.

This is in contrast with EEPROMs in which individual bits, words, or banks of bits may be electrically erased without effecting the remaining bits in the array. EEPROMs utilize Fowler-Nordheim tunneling to add or remove electrons to the floating gate through a thin tunneling oxide near the drain. This quantum mechanical tunneling is achieved in response to a high electric field between the control gate and the drain during the programming and erase steps. EEPROMs are described, for example, in "a 16K E²PROM Employing a New Array Architecture and Designed-in Reliability Features", Yaron et al., IEEE *Journal of Solid-State Circuits*, Vol. SC-17, No. 5, October 1982, pp. 833-840. One difficulty with EPROMs is that, since they are optimized to provide hot carrier injection for programming and erasure, they tend to be somewhat susceptible to inadvertent programming and erasure by the same mechanism.

Heretofore, a manufacturer will select either one of EPROM or EEPROM processes and circuitry for use in a particular device. While EPROM technology is relatively simple from a processing point of view, and therefore less expensive than EEPROM technology, the use of EPROM technology requires that all bits be simultaneously erased utilizing ultraviolet radiation if the contents of any single bit is to be altered. Conversely, while EEPROM technology allows individual bits to be altered, it is a significantly more complex and expensive process.

It is often desirable to have configuration registers within an integrated circuit, allowing the user to specify various alternative modes of operation. Such data is preferably capable of being written by the user, thereby allowing the manufacturer to produce a large number of "generic" devices which are then specifically tailored by end users by programming data into the configuration registers. In many instances, it is important that this configuration information be available at 11 times, and thus it is not suitable for storage as data contained within the memory array.

Accordingly, there remains the need for providing a low cost memory device which is programmable and provides its data at all times. It is particularly desirable to provide such non-volatile data without the need for a clock, in order that the data can serve as a security bit or bits for use in programming the memory cells in a typical programmable device which operates asynchronously.

SUMMARY OF THE INVENTION

In accordance with the teachings of this invention, an EPROM register is programmed in a manner substantially similar to the manner used to program a main EPROM array contained on the same integrated circuit. However, reading information from the EPROM register and the main EPROM array is accomplished differently. To use the data in the main EPROM array, it must be read out by applying appropriate address and output enable signals. Only then, and only during that read cycle, is the data from a particular addressed location within the main EPROM array available on the data bus. When information in that array location is not being read, there is no way to know its contents. More importantly, there is no way to use that data for control purposes, as it is not readily available. In accordance with the teachings of this invention, an EPROM register is utilized which allows the data to be available at all times.

DETAILED DESCRIPTION

Figure 1:
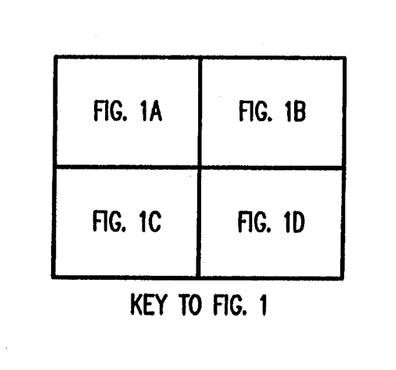
FIG. 1 is a composite figure formed of FIGS. 1A-1D, which show a block diagram depicting one embodiment of a nonvolatile EPROM configuration register constructed in accordance with the teachings of this invention.
Figure 1A:
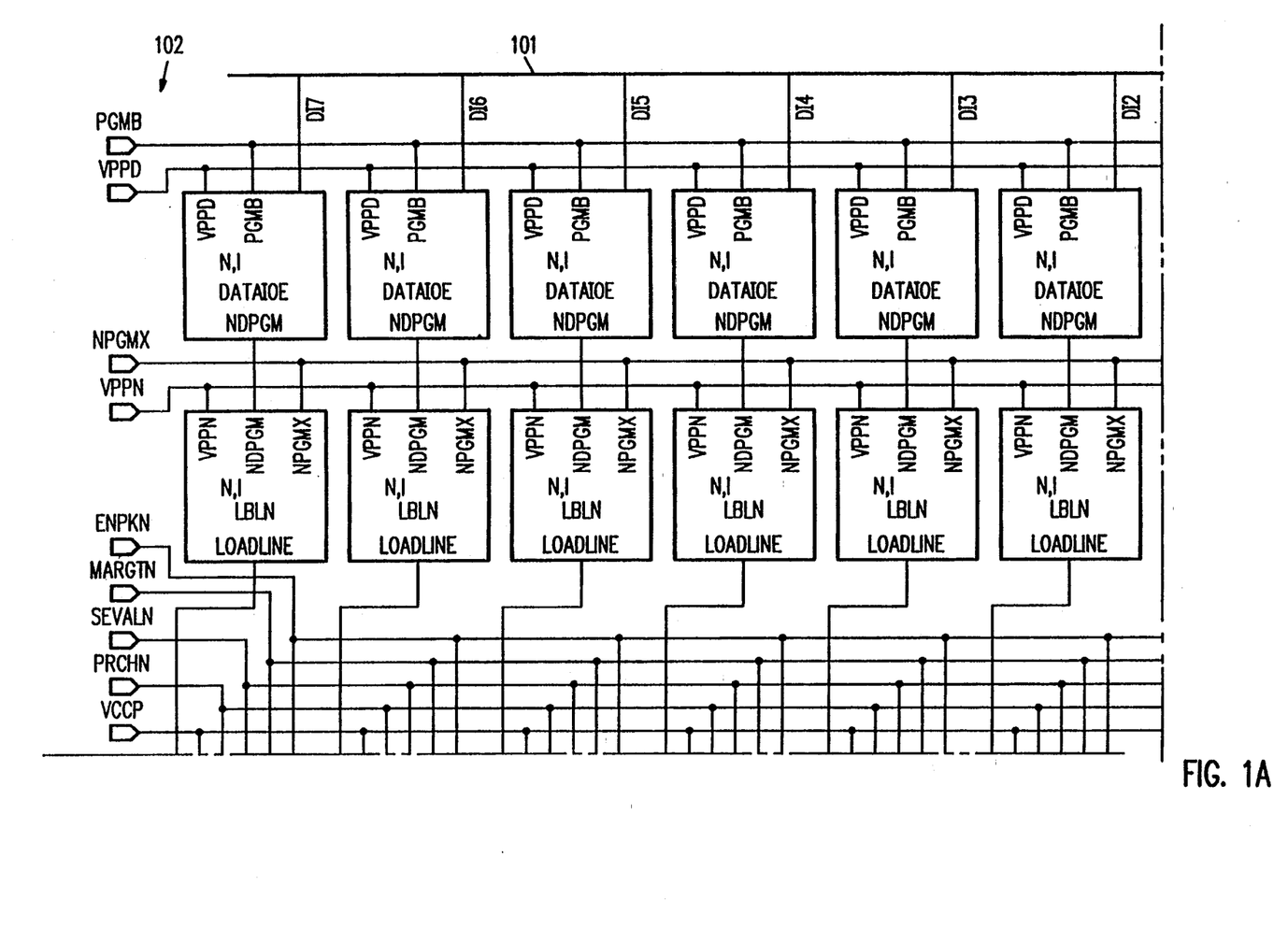
Figure 1B:
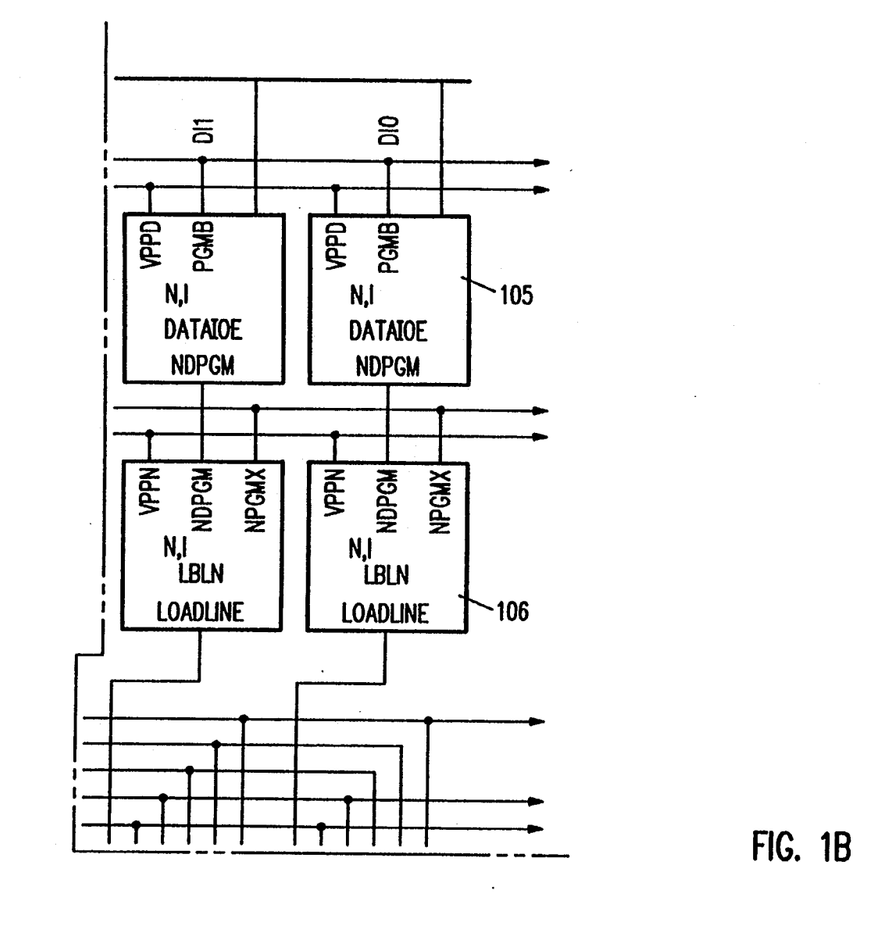
Figure 1C:
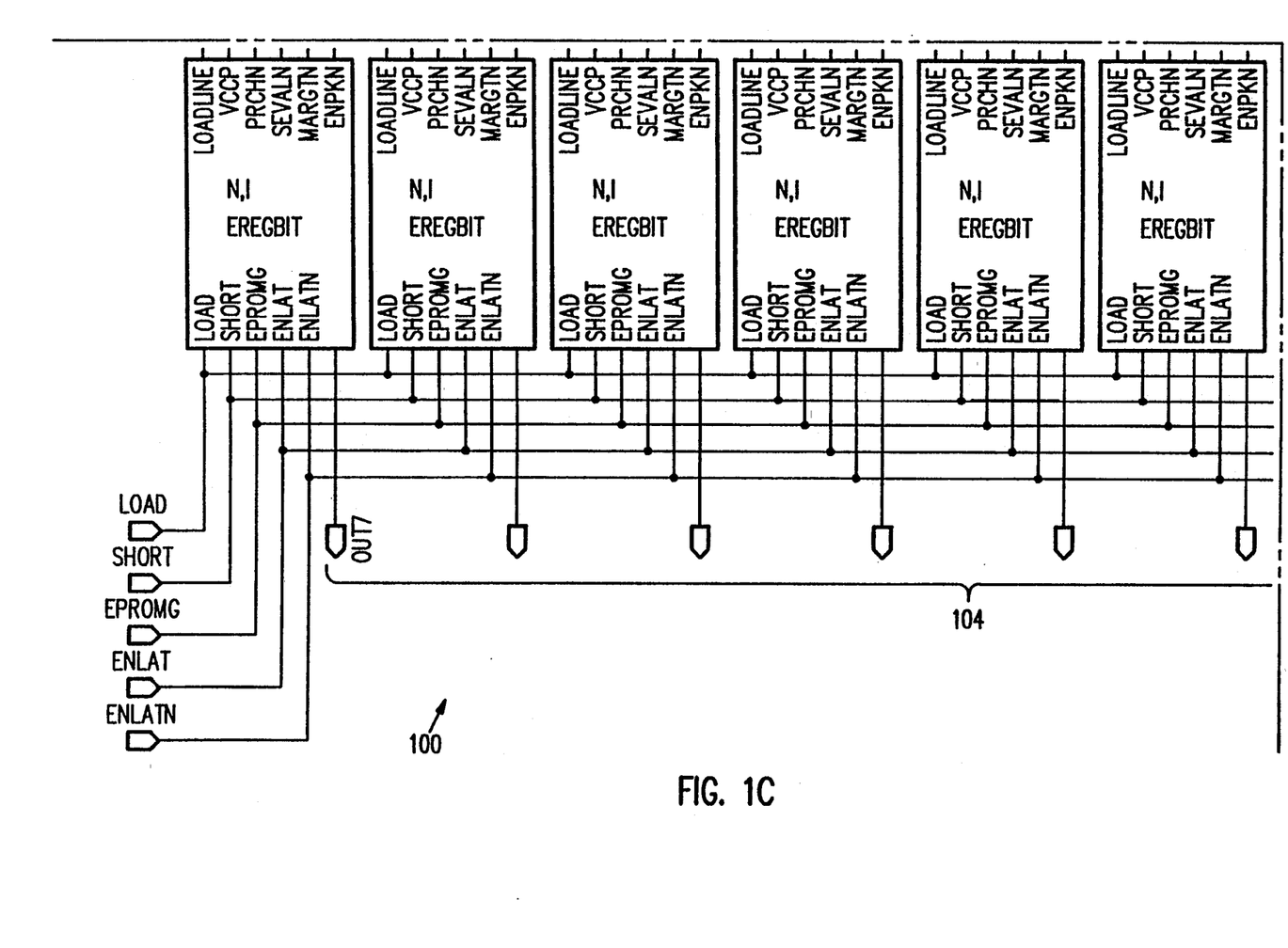
Figure 1D:
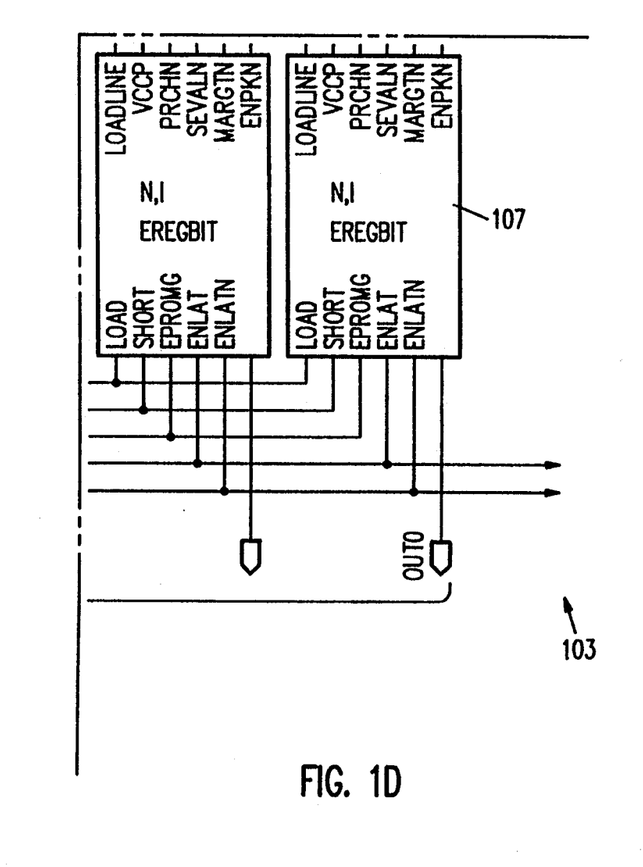
Figure 7:
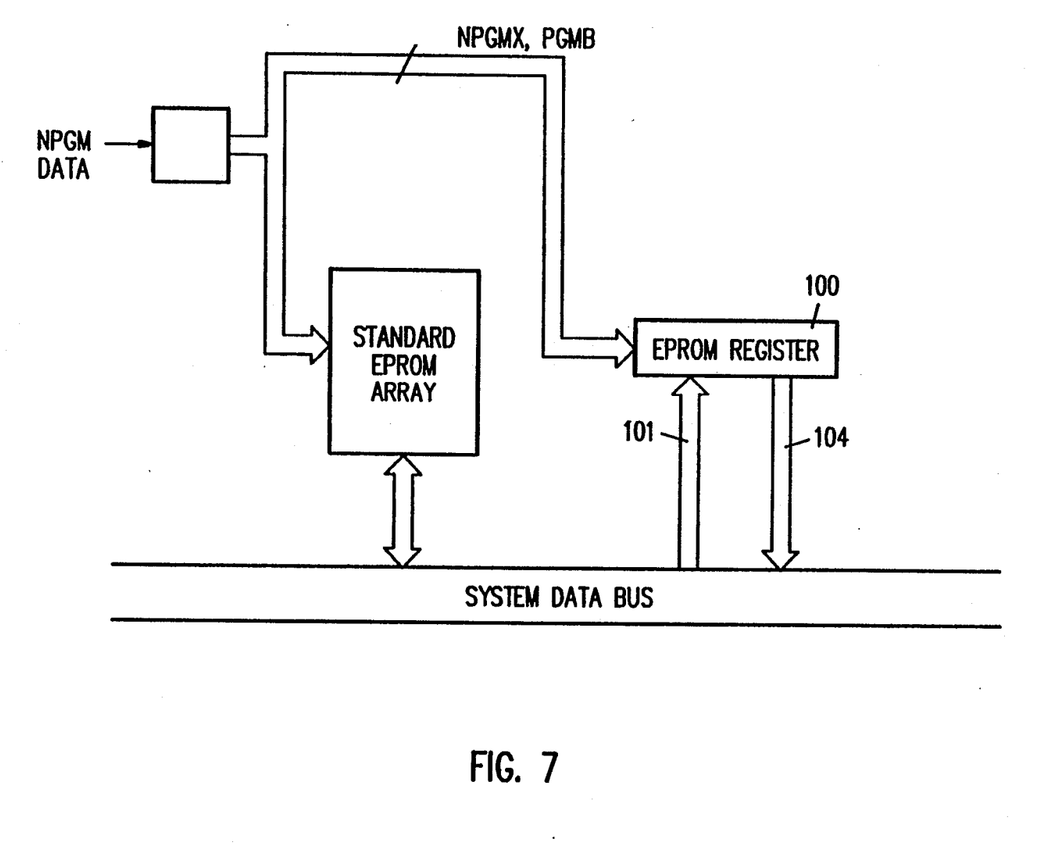
FIG. 7 is a block diagram depicting one embodiment of this invention including a standard EPROM array and an EPROM register.

FIG. 1, including FIGS. 1A-1D, is a block diagram depicting one embodiment of a non-volatile EPROM configuration (ECON) register constructed in accordance with the teachings of this invention. The circuit of FIG. 1 is used, for example, in a more complex integrated circuit such as a microcontroller which includes EPROM memory as shown in FIG. 7. Register 100 serves as a non-volatile memory which can be written, for example, to store configuration information for the integrated circuit, which is capable of being read at any time, without the need for addressing. Register 100 is capable of providing eight output data bits OUT0 through OUT7 on output data bus 104, corresponding to input data DI0 through DI7, respectively, received via input data bus 101 and which, if desired, are applied to additional registers (not shown) similar to register 100.

Table 1 describes the signals shown in FIG. 1.

TABLE 1

| Direction | Signal Name | Description |
| --- | --- | --- |
| Input | DI7-DI0 | programing input data bus |
| Input | PGMB | program pulse, low |
| Input | VPPD | pumped program voltage, for data (approximately 15 volts) |
| Input | NPGMX | Pulse after PGMB trailing edge t.e. |
| Input | VPPN | Program voltage, from pad (approximately 13 volts) |
| Input | ENPKN | Enable precharge keeper, low |
| Input | MARGTN | Margin test, low |
| Input | SEVALN | Static evaluation, low |
| Input | PRCHN | Precharge, low |
| Input | VCCP | Analog voltage, (approximately 2 volts) |
| Input | LOAD | Load |
| Input | SHORT | Short EPROM drain |
| Input | EPROMG | EPROM Gate |
| Input | ENLAT | Enable latch |
| Input | ENLATN | Enable latch, low |
| Internal | NDPGM | Voltage translated, data for programming, low |
| Internal | Load line | High voltage, high current node, for programming |
| Output | OUT7-OUT0 | Register output bits |

It is well known to use PROM programmers for programming data within memory devices. Such programmers are asynchronous devices, i.e. they operate without the use of a clock. Certain complex devices are capable of operating in an EPROM emulation mode, for example, for programming. No clock is present during EPROM emulation mode, thereby allowing the device to be placed in a typical prior art EPROM programmer, for reading and writing EPROM and ECON bits. Also, during EPROM emulation mode, the security functions must be active, in order to prevent unauthorized disclosure of programmed information.

Thus, the ECON register outputs (which may enable, for example, security and configuration functions) must be functional from the moment of power up, even without a clock. This prevents the use of selected EPROM rows to permanently store configuration data, a separate RAM type register to store the configuration information for continuous read, and a synchronous state machine to move data from the EPROM to the register, in place of dedicated ECON registers.

Figure 2:
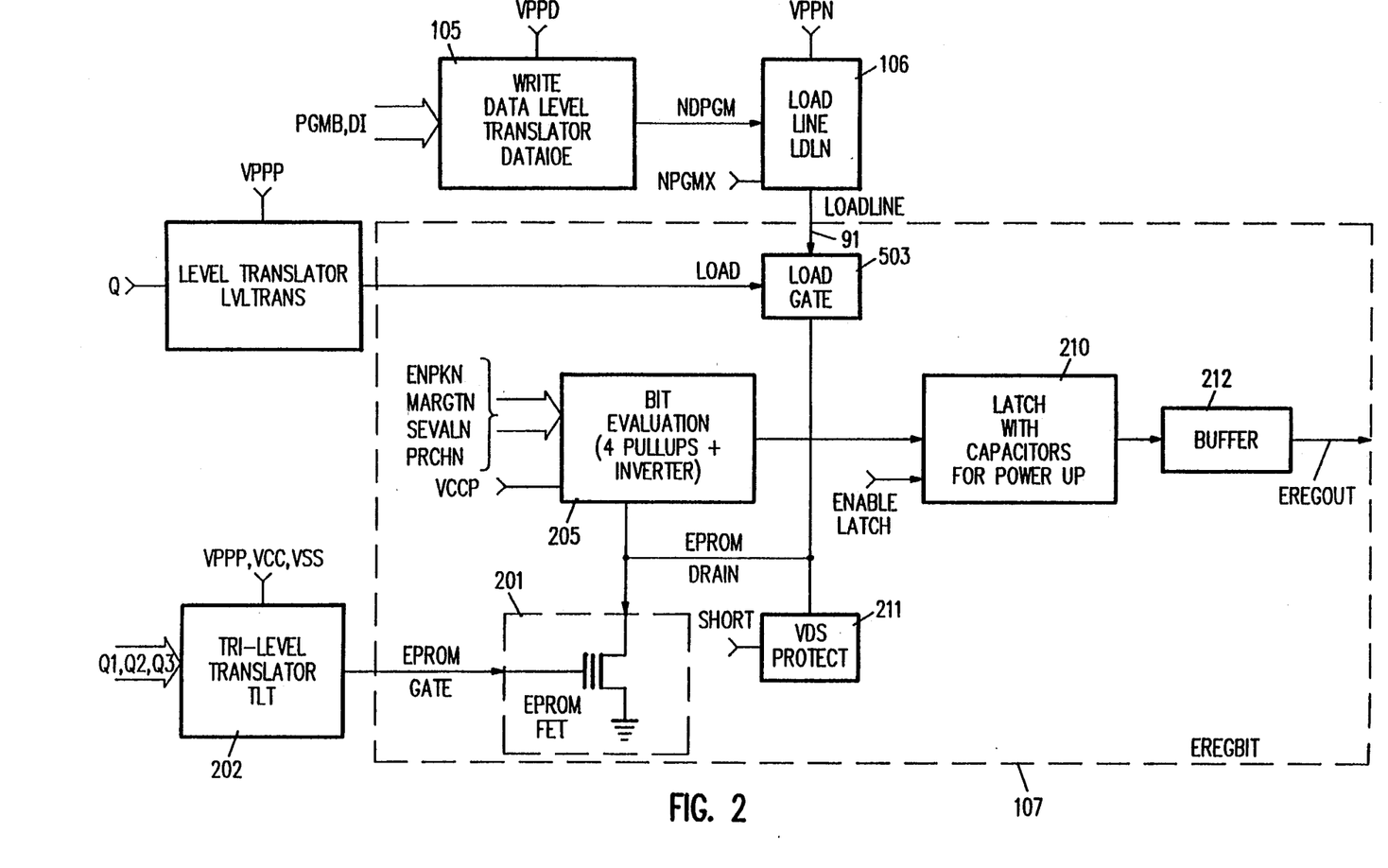
FIG. 2 is a block diagram depicting one embodiment of an EPROM register bit cell of a type used in the EPROM configuration register of FIG. 1.
Figure 3:
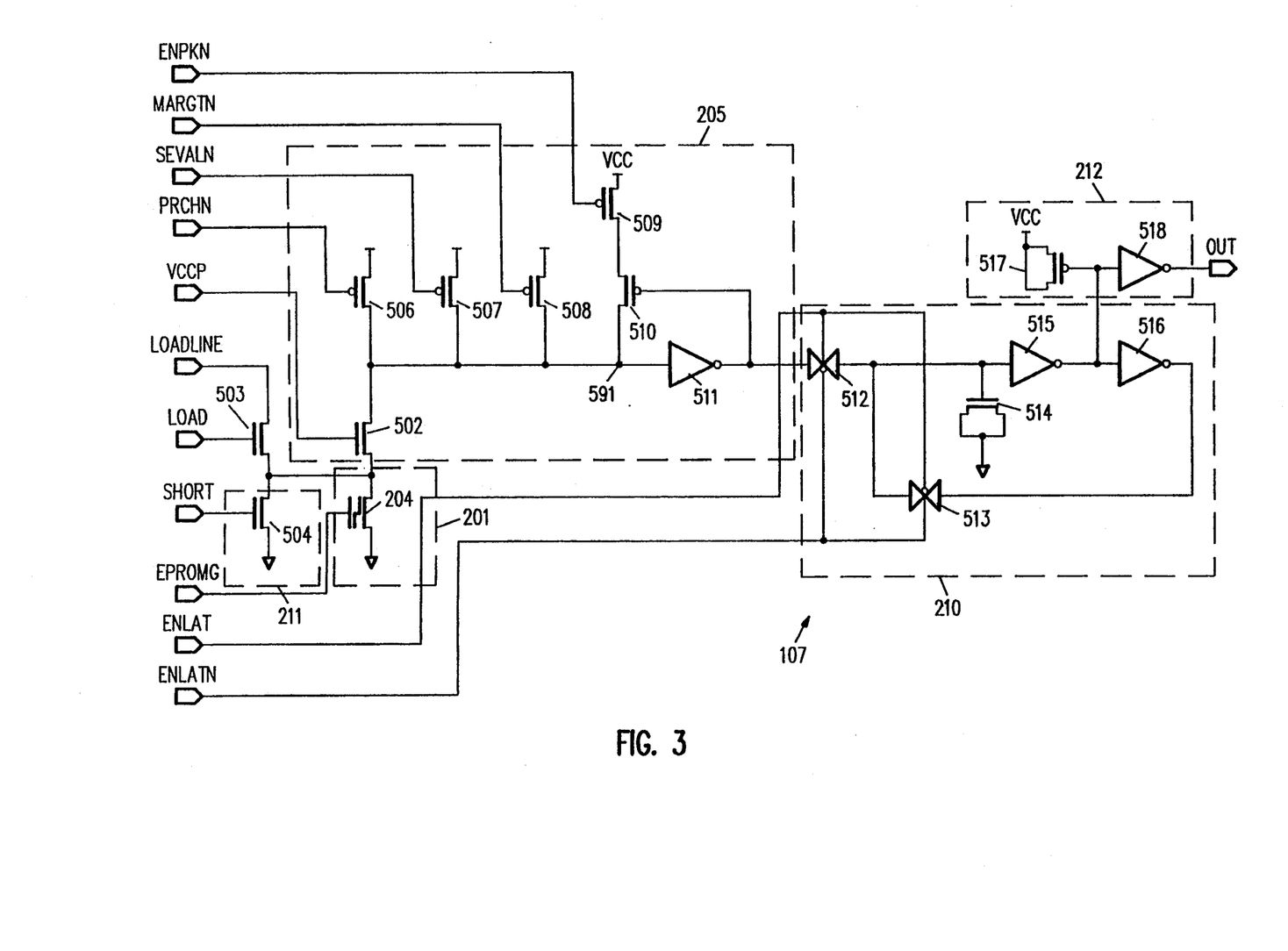
FIG. 3 is a schematic diagram depicting in more detail one embodiment of an EPROM register bit cell shown in the block diagram of FIG. 2.
Figure 6:
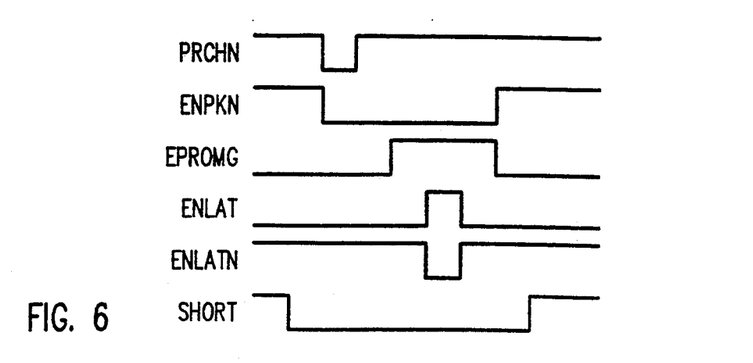
FIG. 6 is a diagram depicting the signals used to perform periodic refresh of latch 210 of the embodiment of FIG. 2.

In FIG. 2, writing to the ECON register via load line cell 106, and evaluation by bit evaluation circuit 205 during the three programming modes, are asynchronous activities. Periodic refresh of latch 210 is synchronous, and done with a clocked state machine (not shown), which provides waveforms such as are shown in FIG. 6, which is described more fully below with reference to the circuit of FIG. 3. Such a clock state machine is well known to those skilled in the art, and thus will not be discussed in more detail here. EPROM FETs (such as 201) are basically analog in nature, and must have a current sense to voltage conversion performed by bit evaluation circuit 205. The circuitry surrounding that operation, such as input control signals shown as input signals to the circuits of FIGS. 2 and 3, is digital. So, the ECON registers and control logic are a mixture of analog, digital, synchronous, and asynchronous circuitry.

There are generally three main ways to perform the current sense to detect the state of an EPROM transistor, such as transistor 201 used in an ECON bit. In a static mode, a weak pullup transistor is turned on. In a dynamic mode, the drain node of EPROM transistor 201 is precharged, then the gate of EPROM transistor 201 is brought to a logical one level to see if it discharges the drain. Or, in a typical sense amplifier (found on ROMs, EPROMs, EEPROMs, RAMs, etc.), precharge the drain of both the device in question and a reference device, take both control gates to a logical one level, and compare the drain voltages using a differential amplifier. The ECONs make use of the first two methods in bit evaluation circuit 205, since the third is prohibitively large to implement once per bit for registers.

Soft programming is a type of failure which can occur if the drain of an EPROM field effect transistor (FET), such as transistor 201, is exposed to ordinary 1 one (Vcc) levels during evaluation, power up, etc. Hot electron generation, in the case of unprogrammed devices, or strong electric fields in the case of programmed devices, can cause electrons to jump onto or off of the floating gate at inopportune moments. This causes undesired changes in threshold voltage resulting in an unreliable or incorrect evaluation of EPROM state, i.e., bad data. Both the main EPROM and the ECON registers make use of an on-chip analog derived voltage VCCP, which is about 2 volts, and a source follower N channel FET 502 in FIG. 3 to prevent the above events.

FIG. 2 is a block diagram depicting one embodiment of an EPROM register bit cell 107 constructed in accordance with the teachings of invention. EPROM register bit cell 107 includes various elements as shown in FIG. 3, which are similarly numbered including, for example, EPROM transistor 201.

To determine whether EPROM transistor 201 is programmed (or conversely, UV erased), it must be evaluated to determine if it will pass source-drain current when a read voltage of approximately Vcc is applied to the gate of EPROM transistor 201. In one embodiment, a plurality of pullups are provided by bit evaluation circuit 205 having an output lead connected to the drain of EPROM transistor 201. This provides versatility and required functionality in different modes of operation.

A static evaluation mode is used during power up and programming of other addresses. For example, if one register byte had already been programmed with control data, it might be desirable to have that control data exert influence during the remainder of the programming. Such control data is used, for example, to enable a security function, or to enable or disable a resource. In order to have this control data available, the EPROM register byte or bytes are statically evaluated. This can occur even while another EPROM register byte or main EPROM byte is being prepared for programming or verification.

Margin test is a sensitive monitoring of the Vcc level applied to the control gate of EPROM transistor 201 at which the bit value stored in EPROM transistor 201 changes state, and thus measures changes in the EPROM threshold voltage $V_T$.

A refresh circuit allows periodic refresh to be performed, for example during normal CPU operation, and is designed to consume low power. The periodic refreshing of the circuitry used to read and buffer the bit value stored in EPROM transistor 201 avoids potential errors due to noise, alpha particle hits, electromagnetic interference, power supply spikes, etc., which might undesirably alter the read value of EPROM transistor 201, stored in latch 210. EPROM soft programming protection takes place within bit evaluation circuit 205. It uses an analog voltage VCCP which is, for example, generated in the main EPROM array (not shown) and made available to EPROM register 200. Generation of VCCP may be accomplished in any desired manner, as is well known in the art. In one embodiment, VCCP is a DC voltage of approximately 2 volts.

Inverter 511 (shown in FIG. 3) within bit evaluation circuit 205 acts as an inverting sense amplifier buffering the drain voltage of EPROM 201, sending a buffered version of the ECON bit value to latch 210. The value stored in EPROM transistor 201 is held in static latch 210, so that when latch 210 is closed the current path through EPROM transistor 201 is allowed to be turned off by EPROMG. This saves power, and keeps the value stored in EPROM transistor 201 stored in latch 210 and available full time for, as an example, controlling and/or configuring other circuitry (not shown). The enable control signal applied to latch 210 opens latch 210 and thus allows latch 210 to operate in a "flow through mode". That is, as long as the latch enable control signal (ENLAT) is active, data from bit evaluation circuit 205 flows through latch 210 and is input to output buffer 212. When the latch enable signal (ENLAT) is inactive, latch 210 retains the most recent data, and bit evaluation circuit 205 may be turned off (deactivated). "Flow through" mode operation of latch 210 is useful in between programming pulses when no clock is present.

In one embodiment, capacitors in latch 210 (such as transistors 514 and 517 of FIG. 3 which are connected to serve as metal oxide semiconductor (MOS) capacitors) cause latch 210 to tend towards a known state upon power up; thus a reset signal is not required. In one embodiment, the state chosen corresponds to a programmed value of EPROM transistor 201. Thus, upon power up, bits OUT0 through OUT7 (FIG. 1) each take a value as if that bit had been programmed, until the actual values stored in their respective EPROM transistors 201 are read, settle, and flow through latch 210.

Output buffer 212 receives the value stored in latch 210 and sends it out of register cell 200 for use by other circuitry (not shown) via configuration lead OUT.

Writing to EPROM transistor 201 requires a voltage control circuit such as voltage level translator circuit 202. (FIG. 2) High voltage is applied to the control gate of EPROM transistor 201 by (tri) level translator circuit 202, and its drain is connected by load line cell 106 to a high voltage, high current supply (to write a logical zero), or allowed to float (to keep the erased, unwritten logical one). Load line cell 106 receives a high voltage VPPN.

The gate of EPROM transistor 201 must be able to take on one of three voltages in response to voltage selection control signals $Q_1$, $Q_2$, and $Q_3$. Vcc (approximately 5 volts) is the sense or evaluation voltage. VPPP, a pumped version of the VPP pin voltage (and typically about 15 v), is the EPROM gate programming level. Vss (approximately 0 volts) is the inactive level. Vcc and VPPP are provided to voltage level translator 202. One embodiment of a voltage control circuit suitable for use as voltage level translator 202 is disclosed in copending U.S. application Ser. No. 07/481,355 on an invention of Hall entitled "Selecting One of A Plurality of Voltages Without Overlap" now U.S. Pat. No. 5,055,705, issued Oct. 8, 1991.

In order to apply a sufficiently high voltage to the drain of EPROM transistor 201 for programming, two other cells are used. Write level translator circuit 105 (FIGS. 1 and 5) combines the program pulse PGMB and the data bus bit value DI, to provide output signal NDPGM which is level translated to VPPD or ground. VPPD is another pumped version, of the VPP pin voltage (typically about 15 v). Approximately 13 v is applied to the VPP pin, to initiate EPROM programming. Its current is steered by load line cell 106 to EPROM transistor 201 for programming. The 15 v from the VPPP supply is used to avoid the voltage drops in the path from the VPP pin (at 13 v) to the EPROM transistor, during programming.

The DATAIOE NOPGM output lead is connected to the NDPGM lead of load line cell 106. Load line cell 106 is a large, current limited switch, to couple the VPP pad (VPPN) to the drain of EPROM transistor 201. In one embodiment, load line cell 106 is shared among all bits in a column, while each bit has a final load gate 503 inside. Load line cell 106 and the data input cell DATAIOE may supply programming voltage and current for any number of registers 107.

A level translated load signal is provided by level translator circuitry LVLTRANS circuitry (detail not shown), which serves as an address to a given one of a plurality of EPROM registers, and sent to the load gate 503. Load gate 503 is used only for programming, when on. "Off" is 0 v, "on" is VPPP (about 15 v).

After EPROM transistor 201 is programmed, the high voltage is discharged from its drain. Vds protect circuit 211 is used to maintain the drain at ground level when neither evaluation nor write are taking place. signal NPGMX input to load line cell 106. Transistor 405, controlled by discharges loadline 91. Signal NPGMX, which is created in the main EPROM array, is a pulse created after the program pulse trailing edge. It turns on a pulldown device to ground contained within load line cell 106, thus discharging the drain of EPROM transistor 201 after its programming has been completed. Note that load line cell 106 may be connected to two or more registers 107 (FIG. 3). Load transistor 503, in register 107, is turned off at the conclusion of the program pulse. If the drain of EPROM transistor 201 and load line cell 106 were not separately discharged after programming, incorrect EPROM evaluation or next address programming could occur.

FIG. 3 is a schematic diagram of one embodiment of an EPROM Register Bit Cell 107, including ECON transistor 201, bit evaluation circuit 205, VDS protection circuit 211, static latch 210, and output buffer 212. This embodiment provides a very compact circuit, particularly when one considers that register cell 107 gives each ECON bit resources equivalent to an entire sense amplifier 511, latch 210, margin test facility 508, 204, dynamic/pseudo-static refresh 504, 506, 509, 510, power up to safety 514, 517, and protection from EPROM soft programming 502.

The gate of EPROM transistor 201 is available as cell terminal EPROMG. The drain of EPROM transistor 201 is fed programming current through load gate 503. VDS protection circuit 211 includes FET 504 which serves to discharge the drain of EPROM transistor 201 and/or maintain the drain at ground. This protects the drain-to-substrate voltage Vds from floating to unknown voltage levels when EPROM transistor 201 is not in use. This prevents undesired changes in the threshold voltage of EPROM transistor 201 which, if sufficient, would undesirably result in soft programming of EPROM transistor 201.

Further protection against soft programming is provided by VCCP series pass transistor 502. VCCP is approximately 2 volts. When any of the pull ups 506, 507, 508, 509/510 are activated, pass transistor 502 acts as a source follower, with a Vt drop from its gate to source terminal. In this event, the drain of EPROM transistor 201 will not rise above VCCP - Vt, or about 1.3 volts during normal operation and evaluation. During programming, the drain of EPROM transistor 201 is brought to a high voltage by load FET 503. At that time, VCCP pass transistor 502 protects evaluation node 591 and transistors 506, 507, 508, and 510 from experiencing high voltage and breakdown.

Device sizes and ratios play a role in bit evaluation circuit 205 of EPROM register bit cell 107. Bit evaluation circuit 205 serves to determine whether EPROM transistor 201 has been programmed or remains in its UV erased state, with the result appearing on evaluation node 591. The threshold voltage of EPROM transistor 201 is approximately 1.5 volts erased and approximately 7 volts programmed. However, the threshold voltage of EPROM transistor 201, when programmed, may in fact be as low as 5 volts, due to environmental changes such as threshold voltage drift over time or drift due to the number of read cycles or erase/program cycles to which EPROM transistor 201 is subjected. Thus, for evaluation it is necessary to be able to detect the difference in current flow through EPROM transistor 201 when its threshold voltage is approximately 1.5 volts (erased), or 5 volts or greater (programmed).

Static evaluation pullup transistor 507 is sized for a reasonably wide voltage swing, under all possible conditions. That is, hot to cold, low to high Vcc, and for process variations, this analog sense of the programmed state of EPROM transistor 201 will still function. An erased EPROM transistor 201 pulls evaluation node 591, and the drain of EPROM transistor 201, down close to ground, against the current supplied by static evaluation pullup transistor 507. Conversely, a programmed EPROM transistor 201 sinks little or no current. Then, static evaluation pullup transistor 507 charges up evaluation node 591 close to Vcc. The drain of EPROM transistor 201 charges up to VCCP - Vt (about 1.3 volts) and cuts off. Thus, the drain of EPROM transistor 201 has a swing of less than 2 volts, and is thus protected from soft programming. At the same time, evaluation node 591 has a full, rail to rail (Vss to Vcc) swing.

Inverting amplifier 511 buffers the signal on evaluation node 591, which senses the state of the bit stored in EPROM transistor 201.

These three elements, static evaluation pullup transistor 507, EPROM transistor 201, and sense inverting amplifier 511, form the basic core of the evaluation section. Their device sizes dictate much of the rest of that section. Once these three element device sizes are chosen, so as to give the proper signal voltage swings, many of the remaining device sizes follow directly, as will be readily apparent to those of ordinary skill in the art in light of the teachings of this specification.

EPROM transistor 201 is, in one embodiment, set at the same size as the EPROM transistors in the main EPROM memory (not shown), and is of the smallest easily manufactured size possible, and is fabricated in a conventional manner.

Lad, short, and VCCP protection transistors 503, 504, 502, respectively, are chosen to home similar sizes to equivalent transistors in the main EPROM. Computer simulation, with transistor models, was used to set the device size of the static evaluation 507 pull up. Since the EPROM transistor 201 size was chosen first, the device size of static evaluation pull up 507 was adjusted until simulation showed the proper voltages at the EPROM transistor 201 drain and evaluation node 591, as previously described. Also as discussed earlier, the threshold voltage of a programmed EPROM transistor 201 is approximately 5 to 7 volts. In the former case, Vcc may exceed the EPROM threshold slightly. This may result in the evaluation node being pulled down a small way from its rail voltage of Vcc. In order to make sure this does not result in the wrong bit value, the trip point of inverting amplifier 511 is chosen as just a little less than Vcc/2.

Any transistors, other than EPROM transistor 201, in the high voltage (programming) path preferably have longer channel lengths than usual. If transistors 401, 402, 403, 404, 405, and 406 within load line circuit 106 (FIG. 4) and transistors 502, 503, and 504 connected to EPROM transistor 201 had minimum channel lengths, they may experience source to drain breakdown during programming. Transistors having longer channel lengths are also less disturbed by process changes, and don't suffer short channel effects. In particular it is important that inverting amplifier 511 not shift its trip point by much. EPROM transistor 201 is fabricated with minimum channel length, to efficiently generate hot electrons for programming.

Margin test serves as a diagnostic test: the manufacturing plant may wish to monitor changes in the threshold voltage of EPROM transistor 201 during burn in, temperature, Vcc, humidity or other environmental cycling, erasure/program life cycles, process changes, etc. Customers may check to see if the bit stored in EPROM transistor 201 stays programmed with an elevated Vcc. Returned, failed die can be margin tested to see if a problem is due to EPROM transistor 201, be it process, application, or handling related.

Externally, margin test is performed by setting Vcc to a given level, activating margin test mode, then reading data from EPROM transistor 201. Then, Vcc is increased (for example, by 0.1 volt) and the test is repeated. When a programmed bit reads out incorrectly (as if it were unprogrammed), the value of Vcc is noted.

If this value is out of spec (absolute), or has changed since whatever previous test was performed (relative), then a failure of EPROM transistor 201 is deemed to have occurred.

Margin test consists of an extremely weak pullup via margin test pullup transistor 508, which has a high impedance channel and is activated in place of the static evaluation pullup via static evaluation transistor 507. Action of evaluation node 591 etc., is functionally similar, in that margin test is just a weaker version of static evaluation. For a programmed EPROM transistor threshold voltage Vt of approximately 5 volts, the static evaluation flips the bit output signal available on the output terminal of FIG. 3 at about Vcc=8 volts. The margin test evaluation flips at about Vcc=6 volts. Current drive of a MOSFET is proportional to $(Vin-Vt)^2$. For static evaluation, this is equal to $(8 v - 5 v)^2 = 9$. For margin test, this is equal to $(6 v - 5 v)^2 = 1$.

The current is about nine times as strong when the bit flips for static evaluation, at Vcc=8 v, as when it flips for margin test at Vcc=6 v. This is in approximate agreement with the device size ratios of static pullup transistor 507 and margin test pullup transistor 508. Thus, margin test is a sensitive measure of threshold voltage of EPROM transistor 201, while static evaluation is less likely to flip the bit incorrectly during normal operation.

Precharge transistor 506 and enable precharge keeper transistor 509 work in concert, during periodic refresh of EPROM transistor 201. For this mode, during normal operation, a clocked sequencer (not shown) cycles a dynamic/pseudo-static operation of evaluation node 591. A current savings is realized as compared with static evaluation because there is no DC path. Neither static evaluation nor margin test pullup transistors 507 and 508 are used during periodic refresh.

Action for period refresh is as follows, and is achieved as a result of the periodic refresh waveforms shown in FIG. 6. With the gate of EPROM transistor 201 low (approximately 0 volts) and short transistor 504 turned off, P channel precharge pullup transistor 506 is turned on (i.e., its gate is low). Evaluation node 591 charges up to Vcc (a logical one level, or approximately 5 volts), and the drain of EPROM transistor 201 goes to VCCP−Vt (about 1.3 volts). This happens regardless of whether EPROM transistor 201 is programmed or erased, because its gate is low.

Enable precharge keeper transistor 509 should be on during this time, although it does not contribute much to initial charging of evaluation node 591. Rather, enable precharge keeper transistor 509 is on to avoid any disturbance which might be caused by its later switching. The signal ENPKN, which may be considered a refresh enable signal, controls the enable precharge keeper transistor 509. In any case, as evaluation node 591 rises, the output of inverter 511 falls, and precharge keeper transistor 510 turns on. Since enable device 509 is also on, there is a path to Vcc, and evaluation node 591 is gently kept at the Vcc potential. In this manner, precharge keeper transistor 510 and enable device 509 act as a refresh pullup circuit.

Enable precharge keeper transistor 510 remains on, and precharge pullup transistor 506 is turned off. Then, the gate of EPROM transistor 201 is raised to Vcc. If EPROM transistor 201 is programmed (high threshold voltage), it will not turn on, and neither the drain of EPROM transistor 201 nor evaluation node 591 will discharge.

Conversely, if EPROM transistor 201 is erased (low threshold voltage), it will turn on. Both the drain of EPROM transistor 201 and evaluation node 591 are discharged to ground. This switches the output signal of inverter 511 to Vcc. This turns off precharge keeper transistor 510, removing the path from Vcc to evaluation node 591.

Thus, in both cases (erased vs. programmed EPROM transistor 201), solid EPROM bit value levels are obtained at the output of the evaluation section. Also, no steady DC path exists between Vcc and Vss. There is, of course, transient current flow, but in either steady state, no current flow takes place other than a minor amount of leakage.

The size of precharge pullup transistor 506 is not critical. In one embodiment, precharge pullup transistor 506 is sized to be able to charge up evaluation node 591 and the drain of EPROM transistor 201 in much less than one clock cycle, under all conditions. The same size is used for enable precharge keeper transistor 509. Precharge keeper transistor 510 is the same size as static evaluation pullup transistor 507, for similar reasons. If the precharge keeper transistor 510 were not equal to the static evaluation transistor 507 size, improper EPROM bit evaluation might occur during periodic refresh. For example, if the precharge keeper transistor 510 was too large, its current would be too great for an unprogrammed EPROM transistor 201 to sink. This would result in the evaluation node 591 not being pulled close to ground (Vss level), and the wrong bit value being amplified and latched. Conversely, too small a precharge keeper 510 transistor size would be too easy for a marginally programmed EPROM transistor 201 to pull down, resulting in low Vcc bit flip.

It is important to note that, in certain circumstances, without a precharge keeper, the evaluation node would slowly discharge, and an erroneous bit value would result.

Complementary clocked transfer gate feedback D type latch 210 follows the evaluation section. The clocks are called enable latch (ENLAT) and its complement (ENLATN), and open the forward path 512 (to conduct) while closing the feedback path 513 (to cease conducting), or vice versa. One or more buffers are used in this embodiment to provide one or more buffered output signals of desired polarity. Such buffers are exemplified by buffers 515, 516, and 518 of FIG. 3 with, in this embodiment, the desired output signal being provided on the output lead of inverter 518. If desired, a complimentary output signal can be provided by utilizing the output signal of buffer 515.

Inside latch 210, two capacitor connected FETs 514 and 517 are used. N type FET 514 has its source and drain connected to ground, and has the substrate serving as its capacitor back plate P type 5117 has its source and drain connected to Vcc, and has its N- well serving as its backplate. Upon power up, each capacitor tends to pull its gate towards its back plate potential. They are arranged so that a known value will be in the latch 210 initially, until the latch 210 is opened up and the new value of the EPROM bit flows through. Since no reset is required, this helps thwart hostile attempts to break security.

Inverter 518 buffers the bit value. The buffered bit value is sent out of the cell driven by inverter buffer 518 so that external signal loads will not upset the value stored in latch 210.

Figure 4:
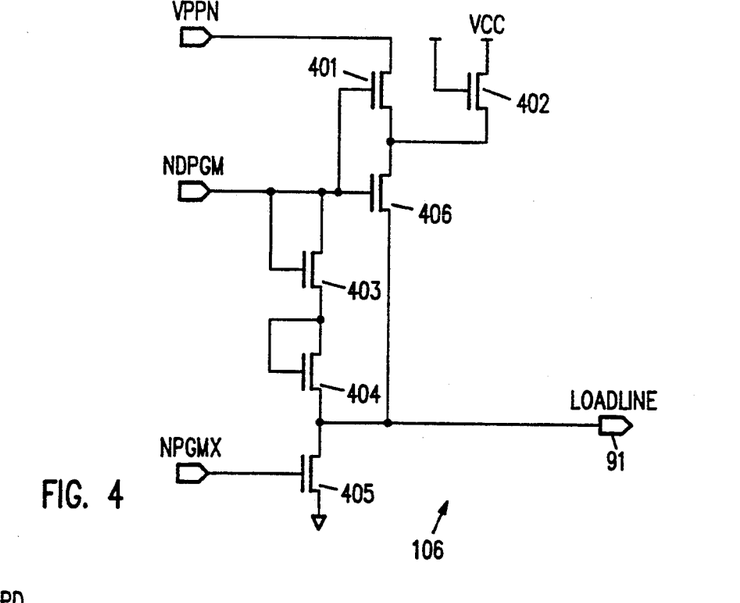
FIG. 4 is a schematic diagram of one embodiment of load line of the block diagram of FIG. 2.

FIG. 4 is a schematic diagram of one embodiment of load line cell 106. Load line cell 106 includes 6 transistors, for which a wide variety of device sizes can be utilized in accordance with the teachings of this invention. High voltage on data program line NDPGM turns on both FETs 401, 406 in the path from VPPN to the load line cell output lead 91. This allows programming current to be available to EPROM transistor 201 (FIGS. 2 and 3).

Diode connected FET 402 serves as a reverse polarity protection. If the VPP pin (connected to VPPN, and used for programming) were connected to a voltage below Vss (accidentally or deliberately), it is possible that EPROM damage or deprogramming could occur. To prevent this, protection device 402 will not allow the node between the pass transistors 401 and 406 to fall below Vcc - Vt, or about 4 volts.

NPGMX FET 405 is used to discharge the high voltage from load line terminal 91. Input signal NPGMX is a pulse provided after the trailing edge of the program pulse. The program pulse PGMB, active low, is applied to the terminal of that name of the program data level translator cell shown in FIG. 5, which generates the NDPGM signal. Both the program pulse PGMB and the NPGMX pulse after the trailing edge of PGMB are provided by control circuitry (not shown, but of an ordinary nature known to those of ordinary skill in the art).

Two diode connected FETs 403 and 404 are used between the data program input terminal NDPGM and load line output terminal 91. They place a constraint of two diode drops (2 Vt) across the gate to source of FET 406. This acts to limit the current from VPPN to drain of EPROM 201 via load line terminal 91, because that current is maintained by Vgs and the device size of FET 406. One requirement is that the NDPGM generator (described below with reference to FIG. 5) must have a weak pullup, so that the NDPGM signal voltage can be pulled down by diode connected FETs 403 and 404. In practice, EPROM FET 201 itself is usually sufficiently current limited. Utilizing transistors 403 and 404 to assist in pulling down the NDPGM voltage assists in preventing other portions of the circuit from being damaged by an excessive voltage on load line terminal 91.

Figure 5:
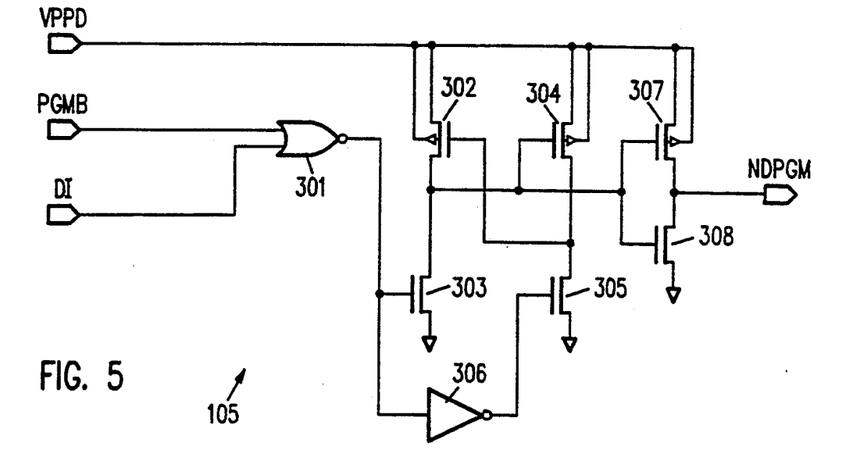
FIG. 5 is a schematic diagram of one embodiment of write data level translator circuit 105 of the embodiment of FIG. 2.

FIG. 5 is a schematic diagram of one embodiment of write level translator circuit 105 of FIG. 1. Data DI and the program pulse PGMB are input to NOR gate 301. The essence of a level translator comprised of devices 302, 303, 304, 305, and 306 is cross coupling and complementary operation. When one side pulls down, the other pulls all the way up to the high voltage supply level. This fully turns off the first side's pullup transistor, so no DC current drain path exists. The output transistors 307 and 308 are similar to an ordinary inverter, except for the weak pullup transistor 307 (whose necessity was noted previously with reference to load line circuit 106 of FIG. 4) and the power supply connection. In one embodiment, the P channel transistors 302, 304, and 307 of FIG. 5 are fabricated in an N- well, connected to the same high voltage supply, in order to prevent junction breakdown. A further description of level translators is provided in the aforementioned U.S. Pat. No. 5,055,705.

All publications and patent applications cited in this specification are herein incorporated by reference as if each individual publication or patent application were specifically and individually indicated to be incorporated by reference.

Although the foregoing invention has been described in some detail by way of illustration and example for purposes of clarity of understanding, it will be readily apparent to those of ordinary skill in the art in light of the teachings of this invention that certain changes and modifications may be made thereto without departing from the spirit of scope of the appended claims.

What is claimed is:

1. A nonvolatile register comprising:
   a storage transistor having a source, a drain, a control gate, and a floating gate;
   a programming circuit for applying selected voltages to said storage transistor to cause a charge to be stored on said floating gate, thus altering a control gate threshold voltage of said storage transistor in order to store a selected data value; and
   an evaluation circuit for determining what data value is stored in said storage transistor, said evaluation circuit comprising:
   a sense amplifier having an input lead coupled to said storage transistor to detect current flow through said storage transistor and an output lead for providing a data signal in response to said data value stored by said storage transistor;
   a static evaluation circuit comprising a static evaluation transistor having a first current path terminal connected to a first supply voltage, a second current path terminal connected to said input lead of said sense amplifier, and a control terminal for receiving a static evaluation control signal for turning on said static evaluation transistor when static evaluation of said data value stored in said storage transistor is to be performed; and
   one or more additional circuits selected from the group of circuits consisting of a refresh circuit, a margin test circuit, and a precharge keeper circuit for pseudo-static evaluation.

2. A register as in claim 1 wherein said source of said storage transistor is coupled to a second supply voltage and said register further comprises a storage transistor protection circuit comprising a circuit for maintaining said drain of said storage transistor at said second supply voltage.

3. A register as in claim 1, wherein said evaluation circuit includes a first circuit for applying a voltage to said drain of said storage transistor; and
   said nonvolatile register further comprises a voltage control circuit for altering a margin test sense voltage applied to said control gate of said storage transistor during a margin test operation while detecting changes in said current flow through said storage transistor.

4. A register as in claim 3, wherein said first circuit comprises a pull up transistor having a high impedance channel.

5. A register as in claim 1 wherein said input lead of said sense amplifier is connected to said storage transistor through a pass transistor.

6. A register as in claim 5 wherein said nonvolatile register is powered by said first supply voltage and a second supply voltage, and said pass transistor has a control terminal connected to receive a third voltage level between said first and second supply voltages.

7. A register as in claim 1 wherein said register further comprises:

means for coupling said source of said storage transistor to a selected voltage level; and a voltage control circuit for applying a sense voltage to said control gate of said storage transistor; and wherein said evaluation circuit includes:

a first circuit for precharging the drain of said storage transistor, wherein said sense amplifier detects if said drain remains precharged in response to the application of said sense voltage to said control gate of said storage transistor, and provides said data signal in response thereto; and a refresh pull up circuit having an input lead coupled to said output lead of said sense amplifier and an output lead coupled to said input lead of said sense amplifier, said refresh pull up circuit providing on said input lead of said sense amplifier a signal level which corresponds to the signal level on said output lead of said sense amplifier.

8. A register as in claim 7 wherein said refresh circuit further comprises an enable lead for receiving a refresh enable signal defining when said refresh circuit is to operate to provide a signal to said input lead of said sense amplifier.

9. A register as in claim 1 wherein said evaluation circuit includes a first circuit for precharging the drain of said storage transistor and said nonvolatile register further comprises:

means for coupling said source of said storage transistor to a selected voltage level; and a voltage control circuit for applying a sense voltage to said control gate of said storage transistor, wherein said sense amplifier detects if said drain remains precharged in response to the application of said sense voltage to said control gate of said storage transistor, and provides said data signal in response thereto.

10. A register as in claim 9 which further comprises a latch for storing said data signal and providing a latched output signal in response thereto.

11. A register as in claim 10 wherein said pseudostatic evaluation is performed periodically.

12. A register as in claim 10 wherein said latch assumes a selected state upon power up, thereby setting said latched output signal to a known value prior to performing said pseudo-static evaluation.

13. A register as in claim 1 which further comprises a latch for latching said data value and providing a latched output signal.

14. A register as in claim 13 wherein said latch comprises:

an input lead connected to said output lead of said sense amplifier;

an output lead for providing a latched output signal;

a first transmission gate connected between said input lead of said latch and a first node of said latch;

a first buffer having an input lead connected to said first node of said latch, and having an output lead connected to said output lead of said latch;

a second transmission gate coupled between said first node of said latch and said output lead of said first buffer.

15. A register as in claim 14 wherein said latch further comprises a capacitor device connected to said input lead of said first buffer.

16. A register as in claim 14 wherein said first and second transmission gates operate in opposite phase in response to a latch enable signal.

17. A register as in claim 14 which further comprises a capacitor connected to said output lead of said first buffer.

18. A register as in claim 17 wherein said output lead of said first buffer is connected to an output lead of said register through a second buffer.

19. A circuit comprising:

a semiconductor memory array for storing a plurality of data bits; and a nonvolative register, coupled to said memory array, comprising:

a storage transistor having a source, a drain, a control gate, and a floating gate;

a programming circuit for applying selected voltages to said storage transistor to cause a charge to be stored on said floating gate, thus altering the control gate threshold voltage of said storage transistor in order to store a selected data value; and an evaluation circuit for determining what data value is stored in said storage transistor, said evaluation circuit comprising:

a sense amplifier having an input lead coupled to said storage transistor to detect current flow through said storage transistor and an output lead for providing a data signal in response to said data value stored by said storage transistor;

a static evaluation circuit comprising a static evaluation transistor having a first current path terminal connected to a first supply voltage, a second current path terminal connected to said input lead of said sense amplifier, and a control terminal for receiving a static evaluation control signal for turning on said static evaluation of said data value stored in said storage transistor is to be performed; and one or more additional circuits selected from the group of circuits consisting of a refresh circuit, a margin test circuit, and a precharge keeper circuit for pseudostatic evaluation.

20. A register as in claim 19 wherein said source of said storage transistor is coupled to a second supply voltage and said register further comprises a storage transistor protection circuit comprising a circuit for maintaining said drain of said storage transistor at said second supply voltage.

21. A register as in claim 19, wherein said evaluation circuit includes a first circuit for applying a voltage to said drain of said storage transistor; and said nonvolatile register further comprises a voltage control circuit for altering a margin test sense voltage applied to said control gate of said storage transistor during a margin test operation while detecting changes in said current flow through said storage transistor.

22. A register as in claim 21 wherein said first circuit comprises a pull up transistor having a high impedance channel.

23. A register as in claim 19 wherein said input lead of said sense amplifier is connected to said storage transistor through a pass transistor.

24. A register as in claim 23 wherein said nonvolatile register is powered by said first supply voltage and a second supply voltage, and said pass transistor has a control terminal connected to receive a third voltage level between said first and second supply voltages.

25. A register as in claim 19 wherein said register further comprises:
- means for coupling said source of said storage transistor to a selected voltage level; and
- a voltage control circuit for applying a sense voltage to said control gate of said storage transistor; and wherein said evaluation circuit includes:
- a first circuit for precharging the drain of said storage transistor,
- wherein said sense amplifier detects if said drain remains precharged in response to the application of said sense voltage to said control gate of said storage transistor, and provides said data signal in response thereto; and
- a refresh pull up circuit having an input lead coupled to said output lead of said sense amplifier and an output lead coupled to said input lead of said sense amplifier, said refresh pull up circuit providing on said input lead of said sense amplifier a signal level which corresponds to the signal level on said output lead of said sense amplifier.

26. A register as in claim 25 wherein said refresh circuit further comprises an enable lead for receiving a refresh enable signal defining when said refresh circuit is to operate to provide a signal to said input lead of said sense amplifier.

27. A register as in claim 19 wherein said evaluation circuit includes a first circuit for precharging the drain of said storage transistor; and
- said nonvolatile register further comprises means for coupling said source of said storage transistor to a selected voltage level; and
- a voltage control circuit for applying a sense voltage to said control gate of said storage transistor,
- wherein said sense amplifier detects if said drain remains precharged in response to the application of said sense voltage to said control gate of said storage transistor, and provides said data signal in response thereto.

28. A register as in claim 27 which further comprises a latch for storing said data signal and providing a latched output signal in response thereto.

29. A register as in claim 28 wherein said pseudo-static evaluation is performed periodically.

30. A register as in claim 28 wherein said latch assumes a selected state upon power up, thereby setting said latched output signal to a known value prior to performing said pseudo-static evaluation.

31. A register as in claim 19 which further comprises a latch for latching said data value and providing a latched output signal.

32. A register as in claim 31 wherein said latch comprises:
- an input lead connected to said output lead of said sense amplifier;
- an output lead for providing a latched output signal;
- a first transmission gate connected between said input lead of said latch and a first node of said latch;
- a first buffer having an input lead connected to said first node of said latch, and having an output lead connected to said output lead of said latch;
- a second transmission gate coupled between said first node of said latch and said output lead of said first buffer.

33. A register as in claim 32 wherein said latch further comprises a capacitor device connected to said input lead of said first buffer.

34. A register as in claim 32 wherein said first and second transmission gates operate in opposite phase in response to a latch enable signal.

35. A register as in claim 32 which further comprises a capacitor device connected to said output lead of said first buffer.

36. A register as in claim 35 wherein said output lead of said first buffer is connected to an output lead of said register through a second buffer.

* * * * *